United States Patent [19]

Nagayoshi et al.

[11] Patent Number: 4,570,237
[45] Date of Patent: Feb. 11, 1986

[54] MICROPROCESSOR

[75] Inventors: Hiromi Nagayoshi; Hisanori Hamano, both of Hyogo, Japan

[73] Assignee: Mitsubishi Denki Kabushiki Kaisha, Tokyo, Japan

[21] Appl. No.: 486,779

[22] Filed: Apr. 20, 1983

[30] Foreign Application Priority Data

Apr. 21, 1982 [JP] Japan ................................ 57-68211

[51] Int. Cl.[4] ............................................. G11C 13/00
[52] U.S. Cl. ...................................... 365/95; 365/189
[58] Field of Search ......................... 365/95, 189, 230

[56] References Cited

U.S. PATENT DOCUMENTS 4,396,996 8/1983 Oldham .................................. 365/95

OTHER PUBLICATIONS

Motorola, "Microcomputer/Microprocessor (MCU/MPU)," by Motorola Corporation, pp. 4-91, 4-98.
Motorola Microprocessors Data Manual, Series B, 1981.

Primary Examiner—Terrell W. Fears
Attorney, Agent, or Firm—Sughrue, Mion, Zinn, Macpeak and Seas

[57] ABSTRACT

A microprocessor includes an internal data memory, made up of a plurality of memory cells, each of which includes first and second inverter circuits. In selected memory cells, the logic state of the cell is predetermined upon initiation of the power supply by arranging the inverters of each cell such that they have different transistor ratios. The difference in ratio may be effected by altering the channel width or length of one of the constituent transistors of the respective inverter circuit.

9 Claims, 4 Drawing Figures

MICROPROCESSOR

BACKGROUND OF THE INVENTION

This invention relates to a microprocessor with an internal data memory, some or all of the data of which are initially set.

FIG. 1 is a block diagram showing one example of a microprocessor. In FIG. 1, reference numeral 1 designates an arithmetic circuit; 2, an accumulator unit; 3, a general purpose register unit; 4, a control circuit; 5, a read-only memory (ROM); 6, an internal data memory; and 7, a power source for driving the internal data memory.

Where the microprocessor thus organized carries out a control or arithmetic operation with the arithmetic circuit 1, the accumulator unit 2, the general purpose register unit 3 and the control circuit 4, the data to be computed or source operands are stored in the internal data memory 6, and the results of the execution of the control or arithmetic operation are generally stored in the internal data memory 6.

The internal data memory in the micro-processor is, in general, made up of a plurality of memory cells which are ramdom access memories.

FIG. 2 is a circuit diagram of a memory cell. In FIG. 2, reference character $Tr_1$ designates an enhancement type driver transistor, and $Tr_3$, a depletion type load transistor which is connected in series with the driver transistor $Tr_1$. The load transistor $Tr_3$ and the driver transistor $Tr_1$ form a first inverter circuit. The source of the driver transistor $Tr_1$ is connected to a ground line GL, the drain of the load transistor $Tr_3$ is connected to a power source line VL, and the gate of the load transistor is connected to the connecting point of its source and the drain of the driver transistor $Tr_1$.

Reference character $Tr_2$ designates an enhancement type driver transistor, and $Tr_4$, a depletion type load transistor which is connected in series with the driver transistor $Tr_2$. These transistors $Tr_2$ and $Tr_4$ form a second inverter circuit. The source of the driver transistor $Tr_2$ is connected to the ground line GL, the drain of the load transistor $Tr_4$ is connected to the power source line VL, and the gate of the load transistor $Tr_4$ is connected to the connecting point of its source and the drain of the driver transistor $Tr_2$. The gate of the driver transistor $Tr_1$ in the first inverter circuit is connected to the drain of the driver transistor $Tr_2$ in the second inverter circuit, while the gate of the driver transistor in the second inverter circuit is connected to the drain of the driver transistor $Tr_1$ in the first inverter circuit. That is, the first and second inverters including the transistors $Tr_1$ through $Tr_4$ form a feedback type flip-flop circuit to store data. Further in FIG. 2, reference characters $Tr_5$ and $Tr_6$ designate writing and reading transfer gate elements. The transfer gate element $Tr_5$ is connected between the drain of the driver transistor $Tr_1$ and a first bit line $BL_1$, and its gate is connected to a word line WL. The transfer gate element $Tr_6$ is connected between the drain of the driver transistor $Tr_2$ and a second bit line $BL_2$, and its gate is connected to the word line WL.

In the memory cell thus organized, ordinary operation is as follows: When a signal is written in the cell through the transfer gate $Tr_5$, the signal is applied to the gate of the driver transistor $Tr_2$. Therefore, the signal, after being amplified and inverted by the second inverter circuit comprising the driver transistor $Tr_2$ and the load transistor $Tr_4$, appears at the drain of the driver transistor $Tr_2$ and is applied to the gate of the driver transistor $Tr_1$. The signal thus processed is amplified and inverted by the first inverter circuit and appears at the drain of the driver transistor $Tr_1$ which is the input point; that is, the data is self-held. In the reading operation, a voltage is applied to the gates of the transfer gate elements $Tr_5$ and $Tr_6$ through the word line, so that the drain voltages of the driver transistors $Tr_1$ and $Tr_2$ are subjected to comparison.

Heretofore, the memory cell shown in FIG. 2 has had a layout pattern as shown in FIG. 3. In FIG. 3, reference character 8a designates an n+ diffusion region which is connected to the first bit line $BL_1$ at one end; 8b, an n+ diffusion region connected to the second bit line $BL_2$ at one end; 8c, an n+ diffusion region which is substantially in the form of a reversed "S", the region 8c being connected to the n+ diffusion region 8b at one end. Further in FIG. 3, reference character 9a designates a polycrystalline silicon region which is laid over the n+ diffusion region 8a and 8c to form the depletion type load transistor $Tr_3$ and the driver transistor $Tr_2$, respectively; reference character 9b designates a polycrystalline silicon region laid over the n+ diffusion regions 8b and 8c to form the depletion type load transistor $Tr_4$ and the driver transistor $Tr_1$, respectively; and reference character 9c designates a polycrystalline silicon region connected to the word line WL and which is laid over the n+ diffusion regions 8a and 8b to form the transfer gate elements $Tr_5$ and $Tr_6$, respectively. Further in FIG. 3, reference characters 10a through 10c designate contact holes which connect the n+ diffusion regions 8a through 8c to the polycrystalline silicon regions 9a and 9b as illustrated; 11a, an aluminum wiring line connected to the power source line VL and connected to the n+ diffusion regions 8a and 8b respectively through contact holes 12a and 12b; and 11b, an aluminum wiring line which is connected to the ground line GL and is connected through a contact hole 12c to the middle point between the driver transistors $Tr_1$ and $Tr_2$ formed by the n+ diffusion region 8c.

In the memory cell having the above-described layout pattern, for stable writing and reading operations the sizes (channel length and channel width) of the transistors are in a certain ratio, and the first and second inverter circuits are symmetrical with each other, i.e., they are designed so as to be equal in transistor size parameters, thus having equivalent "on" levels.

Accordingly, when the power source is connected to the memory cell, its bit logic is set to "1" to "0". However, the memory cell is unstable, because the transistors in the pair of inverter circuits are equally arranged and there is no element which can determine which of the logic values should be selected. Furthermore, the drain voltages of the driver transistors $Tr_1$ and $Tr_2$, i.e., the held data, are affected because of fluctuations in the transistor sizes and in the threshold voltages of the transistors $Tr_1$ through $Tr_4$, and fluctuation in the values of resistors and capacitors provided together with the memory cell, when the power switch is turned on. Accordingly, in the microprocessor having the internal data memory 6 using the memory cells shown in FIG. 3, the data in the internal data memory 6 is unstable when the power switch is turned on. Therefore, when control and operation functions are carried out with the arithmetic circuit 1, the accumulator unit 2, the general purpose register unit 3 and the control circuit 4, and in the case where the data stored in the internal data memory 6 are used as the source operands, it is necessary that data be written in the internal data memory by means of software such as a monitor program in advance, for initial setting. This is undesirable from the viewpoint of the effective use of software. Furthermore, the initial setting program, which is required only when the power switch is turned on, requires a program memory region like an ordinary program.

SUMMARY OF THE INVENTION

In view of the foregoing, an object of this invention is to provide a microprocessor with an internal data memory which has a plurality of memory cells each having first and second inverter circuits, in which, according to the invention, the transistor ratios of the paired inverter circuits in some or all of the memory cells in the internal data memory are arranged so that some or all of the memory cells provide preset values when the power switch is turned on, whereby the writing of initial setting data in the internal data memory or the use of an initial setting program is eliminated.

DETAILED DESCRIPTION OF THE PREFERRED EMBODIMENTS

Figure 1:
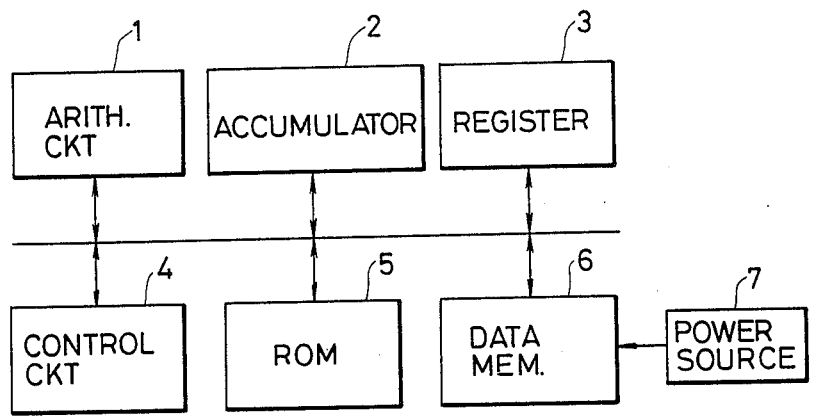
FIG. 1 is a block diagram showing one example of a microprocessor.
Figure 2:
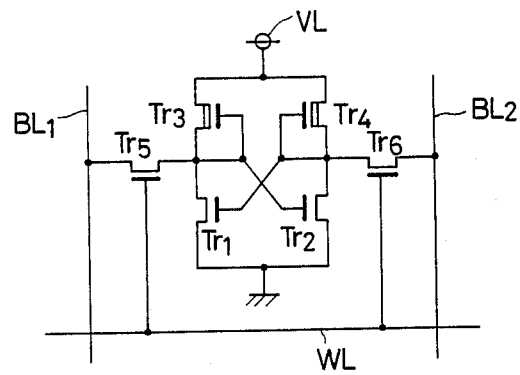
FIG. 2 is a circuit diagram showing one memory cell of an internal data memory.
Figure 3:
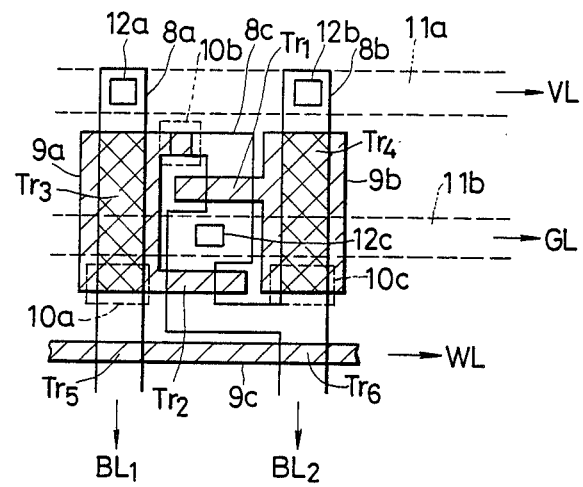
FIG. 3 is an explanatory diagram showing a conventional layout pattern for the memory cell of FIG. 2.
Figure 4:
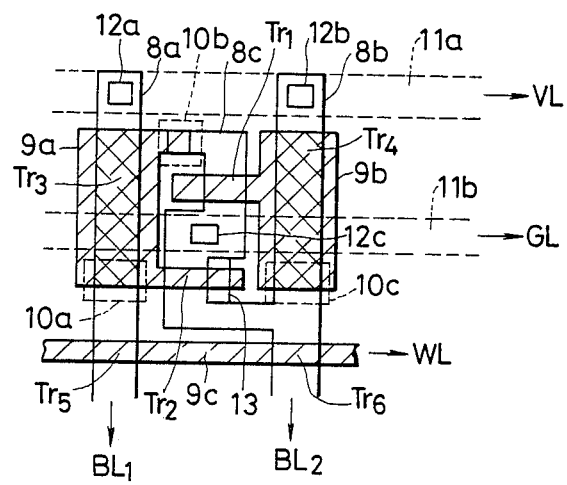
FIG. 4 is an explanatory diagram showing a layout pattern according to the invention for the memory cell of FIG. 2.

One embodiment of this invention will now be described with reference to FIG. 4. In FIG. 4, those components which have been previously described with reference to FIG. 3 are accordingly designated by the same reference characters.

In FIG. 4, reference numeral 13 designates an n+ diffusion region adapted to change the channel width of the driver transistor $Tr_2$ in the second inverter circuit. The region 13 is connected to the n+ diffusion region 8c. Thus, the "on" level of the second inverter circuit is decreased, so as to be lower than that of the first inverter circuit by the provision of the n+ diffusion region 13.

In the above-described embodiment, the transistor size is changed by the provision of the n+ diffusion region 13. However, it should be noted that the "on" level is not decreased to the extent that an erroneous operation in which written data "L" is held as data "H" could be carried out.

With the memory cell constructed as described above, the "on" level of the second inverter circuit is lower than that of the first inverter circuit. Accordingly, when the power source is connected to the memory cell, the drain potentials of the driver transistors $Tr_1$ and $Tr^2$ are determined when the power switch is turned on, and the bit logic level of the memory cell is thus stably set to "1" or "0".

Whether the bit logic level is set to "1" or "0" when the power switch is turned on is predetermined because the drain potentials of the driver transistors $Tr_1$ and $Tr_2$ are determined by the arrangement of the n+ diffusion region 13 of the driver transistor $Tr_1$ of the first inverter circuit or the driver transistor $Tr_2$ of the second inverter circuit.

Thus, if the channel width of the driver transistor $Tr_1$ or $Tr_2$ is changed by accordingly providing the n+ diffusion region 13 for the driver transistors $Tr_1$ or $Tr_2$ of desired memory cells in the internal data memory according to the requirements of the user, then the internal data memory 6 may be made to hold data as required by the user when the power switch is turned on.

Thus, according to the invention, the conventional initial setting operation of writing data into the internal data memory 6, and the initial setting program which was required only when the power switch was turned on, can be eliminated.

The ordinary operation of the memory cell in FIG. 4 is similar to that of the memory cell in FIG. 3.

In the above-described embodiment, the n+ diffusion region 13 is arranged for the driver transistor $Tr_1$ of the first inverter circuit or the driver transistor $Tr_2$ of the second inverter circuit to change the channel width thereof: however, alternatively, the channel length may be changed. Furthermore, the n+ diffusion region 13 may be arranged so as to change the channel width or length of a load transistor $Tr_3$ or $Tr_4$. In addition, the sizes of the polycrystalline silicon regions 9a or 9b may be designed so that one of the transistors $Tr_1$ and $Tr_3$ in the first inverter circuit or one of the transistors $Tr_2$ and $Tr_4$ in the second inverter circuit is changed in channel width or length, whereby the bit logic level of the memory cell is set when the power switch is turned on. All that is fundamentally necessary to obtain the same effect is to make the first inverter circuit different from the second inverter circuit in transistor ratio.

As is clear from the above description, in a microprocessor having an internal data memory which includes a plurality of memory cells each having first and second inverter circuits, according to the invention, the first and second inverter circuits in a desired memory cell or cells are made different from each other in transistor ratio, so that the logic value of this memory cell or cells is defined when the power switch is turned on.

Accordingly, if the transistor ratio of the first and second inverter circuits of a desired memory cell or cells in the internal data memory is changed as required by the user, the data in the internal data memory device may be fixed as required by the user when the power switch is turned on, making it unnecessary to perform any initial setting operation for the program memory. Furthermore, by using the data of the internal data memory as fixed upon connection of the power source, the internal data memory can be utilized as a program memory immediately after reset. Thereafter, it may be used as an ordinary data memory, thus remarkably improving memory efficiency. In the case where the internal data memory is used as a program memory as described above, it is necessary that the program counter address the internal data memory immediately after reset.

What is claimed is:

1. A microprocessor, comprising; an internal data memory have a plurality of memory cells, each of which includes first and second inverter circuits, said inverter circuits each comprising a load transistor and a driver transistor, selected memory cells in said internal data memory having a first inverter circuit different in transistor ratio from said second inverter circuit;

wherein an n+ diffusion region is provided and adapted to change a channel width of said driver transistor in one of said inverter circuits, said n+ diffusion region being connected to an n+ diffusion region of said load transistor in the other of said inverter circuits.

2. A microprocessor as claimed in claim 1, wherein that portion of said internal data memory comprised of memory cells having said first and second inverter circuits different from each other in transistor ratio further constitutes a program memory.

3. A microprocessor as claimed in claim 1, wherein said difference in transistor ratio among said first and second inverters is effected by providing one of said driver transistors with channel dimensions different from that of the other.

4. A microprocessor as claimed in claim 3, wherein an n+ diffusion region is provided for increasing the width of said channel.

5. A microprocessor as claimed in claim 3, wherein a polycrystalline silicon region is provided for increasing the length of said channel.

6. A microprocessor as claimed in claim 1, wherein said transistor ratio of one of said inverters is varied from that of the other by providing an n+ diffusion region in a manner so as to increase the dimensions of the channel of one of the transistors thereof, thereby decreasing the turn-on level of said one inverter.

7. A microprocessor as claimed in claim 6, said n+ diffusion region being provided for increasing the width of said channel.

8. A microprocessor as claimed in claim 6, said n+ diffusion region being provided for increasing the length of said channel.

9. A microprocessor as claimed in claim 1, wherein said transistor ratio of one of said inverters is varied from that of the other by providing a polycrystalline silicon region for one of said transistors of a size such as to vary the dimensions of a channel region thereof.

* * * * *